United States Patent [19]

Sato

[11] Patent Number: 4,938,258
[45] Date of Patent: Jul. 3, 1990

[54] POWER SUPPLY SYSTEM FOR SOLENOID VALVES

[75] Inventor: Hideharu Sato, Soka, Japan

[73] Assignee: SMC Corporation, Tokyo, Japan

[21] Appl. No.: 353,168

[22] Filed: May 12, 1989

Related U.S. Application Data

[63] Continuation of Ser. No. 187,466, Apr. 28, 1988, abandoned.

[30] Foreign Application Priority Data

Apr. 30, 1987 [JP] Japan .............................. 62-66133[U]

[51] Int. Cl.$^5$ ............................................. F16K 31/06
[52] U.S. Cl. .................................... 137/884; 137/560; 137/269
[58] Field of Search .................... 137/560, 561 R, 884, 137/269

[56] References Cited

U.S. PATENT DOCUMENTS

| 3,438,463 | 4/1969 | Gruber | 137/269 X |
| 3,698,432 | 10/1972 | Kurtz | 137/271 X |
| 4,399,836 | 8/1983 | de Versterre et al. | 137/884 X |
| 4,507,707 | 3/1985 | Willis | 137/884 X |
| 4,512,362 | 4/1985 | Groeschner | 137/884 X |
| 4,524,807 | 6/1985 | Toliusis | 137/884 |
| 4,815,496 | 3/1989 | Nishitani et al. | 137/884 |

FOREIGN PATENT DOCUMENTS

| 60-104876 | 6/1985 | Japan | 137/884 |
| 61-126163 | 8/1986 | Japan | 137/884 |

Primary Examiner—John C. Fox
Attorney, Agent, or Firm—Oblon, Spivak, McClelland, Maier & Neustadt

[57] ABSTRACT

A power-supply system for solenoid valves having one or more brackets attached to a manifold base, the brackets support a printed-wiring board carrying a prnted power-supply circuit and power-supply terminals, the use of one or more brackets permit using the same common manifold base with or without the printed-wiring board. Each bracket has a longitudinal opening into which the power-supply terminal is snugly fitted and is attached to one side of the manifold base. A multipolar connector on the printed-wiring board is connected to the power-supply terminals by a power-supply circuit printed on the printed-wiring board. The multipolar connector connects to a power source. When the printed-wiring board is inserted into the brackets, the power-supply terminals stick out from the longitudinal opening in the brackets.

7 Claims, 4 Drawing Sheets

POWER SUPPLY SYSTEM FOR SOLENOID VALVES

This application is a continuation of application Ser. No. 187,466, filed on Apr. 28, 1988, now abandoned.

FIELD OF THE INVENTION

This invention relates to a power supply system for a plurality of solenoid valves mounted on a manifold base.

DESCRIPTION OF THE PRIOR ART

A plurality of solenoid valves are mounted on a manifold base so that they can be integrally controlled. There are several known techniques to simplify the wiring to such solenoid valves using a printed-wiring board that carries a plurality of power-supply terminals and a power-supply control circuit printed thereon (such as the one disclosed in Japanese Provisional Utility Model Publication No. 97887 of 1986).

Such a known power-supply system for solenoid valves has a printed-wiring board held between opposite grooves formed on one side of the manifold base. The advantage of this design is that the printed-wiring board is firmly fastened to the manifold base. But the manifold base must be a special one having the printed-wiring board carrying grooves.

Besides, such manifold bases must be prepared in several different lengths because the length of the manifold base has to be changed with the number of solenoid valves to be mounted thereon. Furthermore, keeping specially designed manifold bases of different lengths in stock gives rise to a troublesome control problem.

OBJECTS OF THE INVENTION

An object of this invention is to reduce the lengthwise varieties of manifold bases and thereby facilitate their control by using common manifold bases not intended for use with a printed-wiring board in the solenoid valve power-supply system of the type mentioned before that employs a printed-wiring board.

Another object of this invention is to reduce the lengthwise varieties of brackets and thereby facilitate their control by using one or more brackets of two different lengths depending on the number of solenoid valves to be mounted on the manifold base.

Still another object of this invention is to facilitate the assembling of the power-supply segment by combining one or more brackets with a printed-wiring board that is longitudinally passed therethrough into a one-piece assembly.

Yet another object of this invention is to facilitate the attachment of the power-supply segment to the manifold base by fastening the end plate and the connector provided at both ends of one or more brackets with bolts.

SUMMARY OF THE INVENTION

In a power-supply system for solenoid valves comprising a plurality of solenoid valves mounted on a manifold base and a printed-wiring board fastened to the manifold base and adapted to supply power from a plurality of power-supply terminals on the printed-wiring board to a plurality of the receiving terminals of the solenoid valves, this invention achieves the aforementioned objects by means of one or more brackets fastened to one side of the manifold base, the bracket having a longitudinal opening into which the power-supply terminals are slidably inserted, with a multipolar connector on the printed-wiring board electrically connected to the power-supply terminals placed side by side along the length of the board through the power-supply circuit printed on the board, the power-supply terminals sticking out from the longitudinal opening of the bracket when the printed-wiring board is inserted therein.

Because the bracket to support the printed-wiring board permits the use of common manifold bases not intended to be used with a printed-wiring board, this type of power-supply system makes it possible to reduce the variety of necessary manifold bases and facilitate their control.

The length of the manifold base and printed-wiring board varies with the number of solenoid valves mounted. This change can be coped with by the use one or more of brackets of two different lengths which are twice and three times that of center-to-center distance between two adjoining solenoid valves. This permits reducing the variety of necessary brackets and facilitate their control.

The power-supply segment is easy to assemble because the printed-wiring board can be longitudinally inserted into one or more brackets. Because the power-supply terminals on the printed-wiring board stick out from the opening in the bracket, power-feed line can be connected thereto with ease.

The end plate and connector at both ends of the bracket facilitate the fastening of the assembled power-supply segment to the manifold base.

DESCRIPTION OF THE PREFERRED EMBODIMENT

Figure 1:
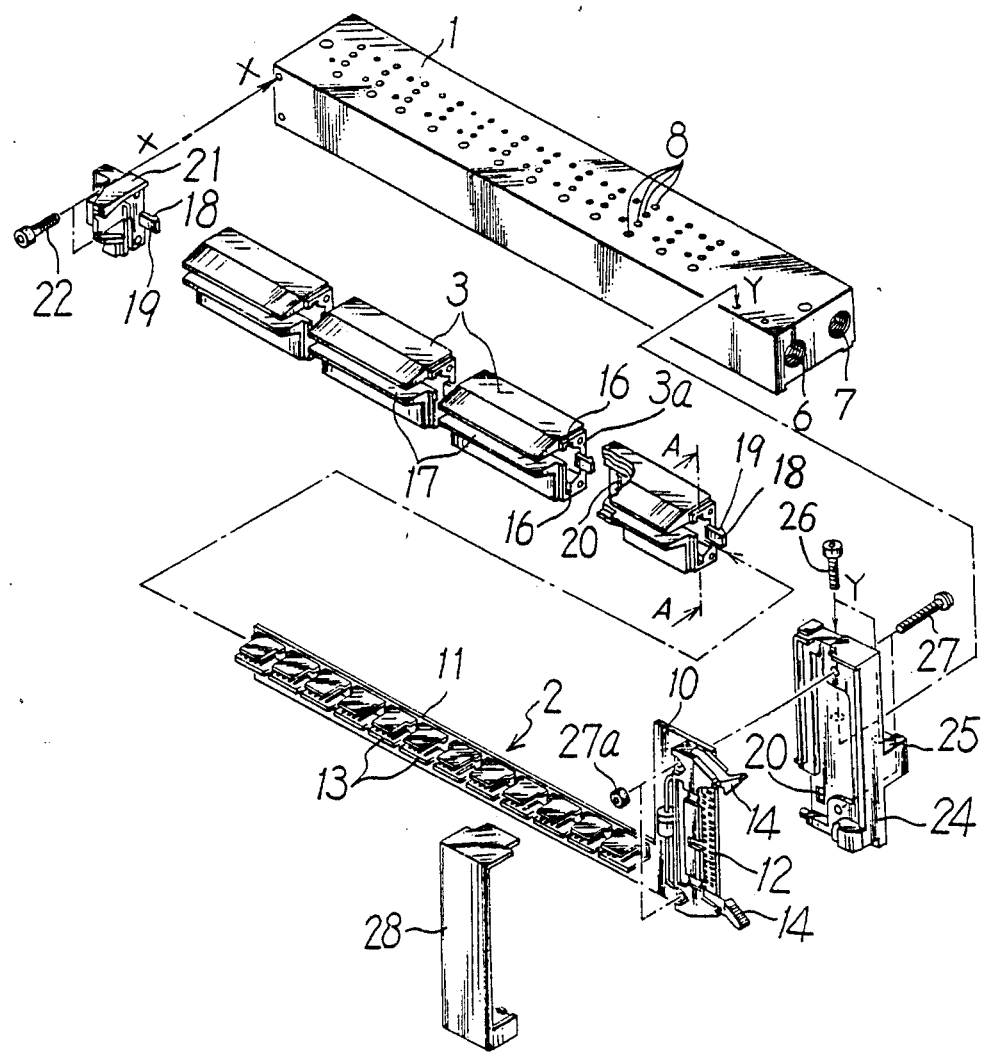
FIG. 1 and FIG. 2 are exploded perspective views showing the way in which a printed-wiring board and solenoid valves are assembled in a preferred embodiment of this invention.
Figure 2:
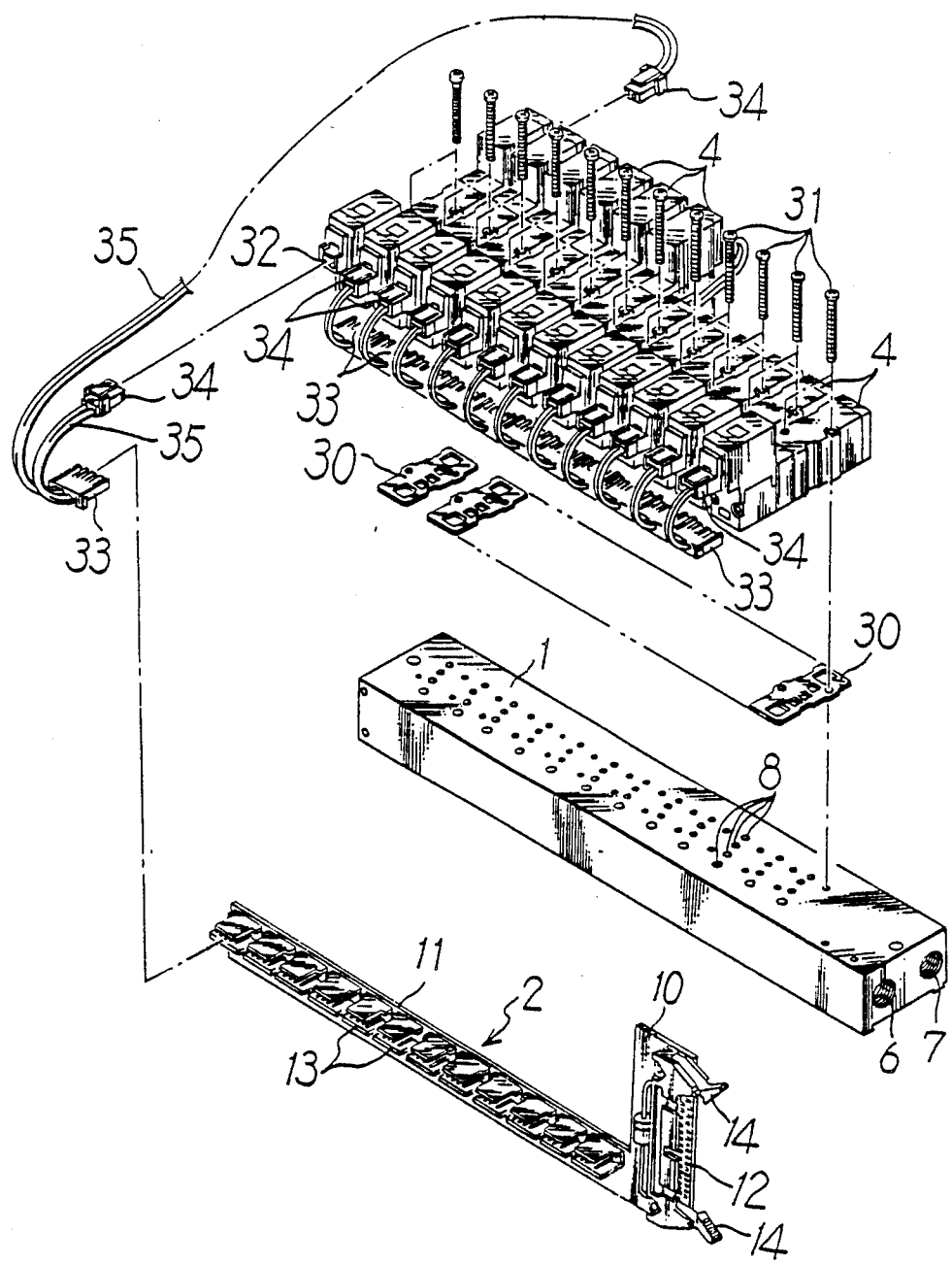
Figure 3:
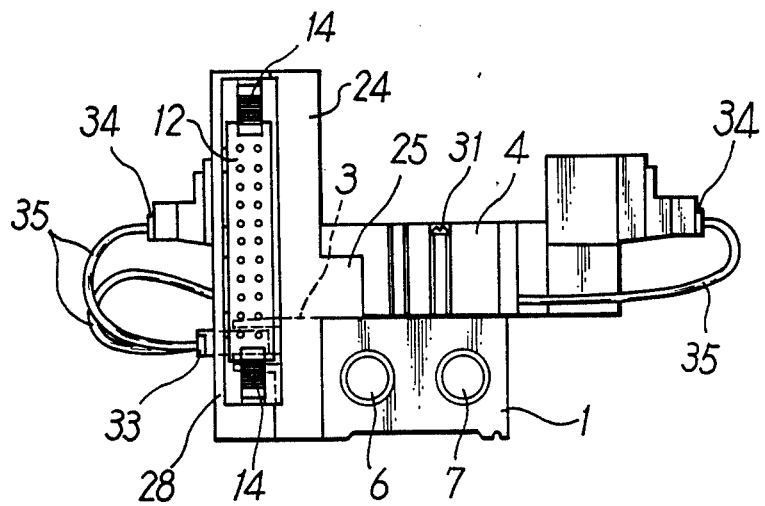
FIG. 3 is a side view.

FIG. 1 and FIG. 2 show preferred embodiments of this invention which comprises essentially of a manifold base 1, printed-wiring board 2, a plurality of brackets 3 and a plurality of solenoid valves 4 to be mounted on said manifold base 1.

The manifold base 1 has a feed passage 6 and a drain passage 7 extending across the length thereof. A plurality of fluid passages 8 separately communicating with each of the passages 6 and 7 are opened in the top surface of the manifold base 1 at given intervals throughout the length thereof. Output ports (not shown) communicating with some of the fluid passages 8 are provided on one side thereof that is at right angles to the top surface.

The printed-wiring board 2 has a vertical fitting 10 containing a multipolar connector 12 and an inserting segment 11 extending sideways therefrom. The inserting segment 11 carries power-supply terminals 13 placed in positions substantially corresponding to the solenoid valves 4 on the manifold base 1, with the pins thereof sticking out at right angles to the inserting segment 11. The multipolar connector 12 and power-supply terminals 13 are connected by a printed power-supply circuit. Pivotal levers 14 to fasten a connector (not shown) to connect the multipolar connector 12 to the power supply are provided at the top and bottom thereof.

While a circuit to control the operation of each solenoid valves 4 is provided in the power-supply circuit on the printed-wiring board 2, necessary electronic parts are provided on the side opposite to the one on which the power-supply terminals 13 of the printed-wiring board 2 are mounted.

Figure 4:
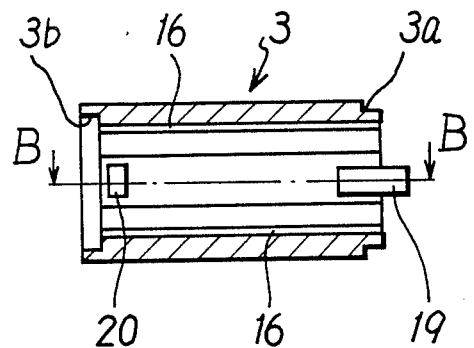
FIG. 4 is a cross-sectional view taken along the line A—A of FIG. 1.
Figure 5:
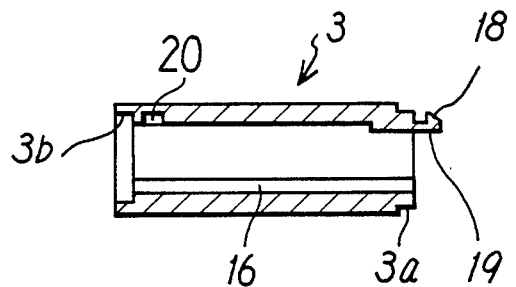
FIG. 5 is a cross-sectional view taken along the line B—B of FIG. 4.

The length of the inverted-L shaped bracket 3 is integral times as long as the center-to-center distance between the adjoining fluid passages 8 or solenoid valves 4. Opposite engaging grooves 16 with which the top and bottom edges of the inserting segment 11 come into engagement are formed near one side of a longitudinal cavity in the vertical portion of each bracket. A longitudinal opening 17 opening outside and into said cavity is provided in the horizontal portion thereof. An engaging projection 3a and a catch 19 having a hook 18 at the tip thereof are provided on one side of a bracket that comes in contact with the opposite side of another bracket. On the opposite side of each bracket is provided a recess 3b (see FIGS. 4 and 5) with which said engaging projection 3a comes into engagement and a recess 20 in the cavity with which said hook 18 comes into engagement are provided.

Figure 6:
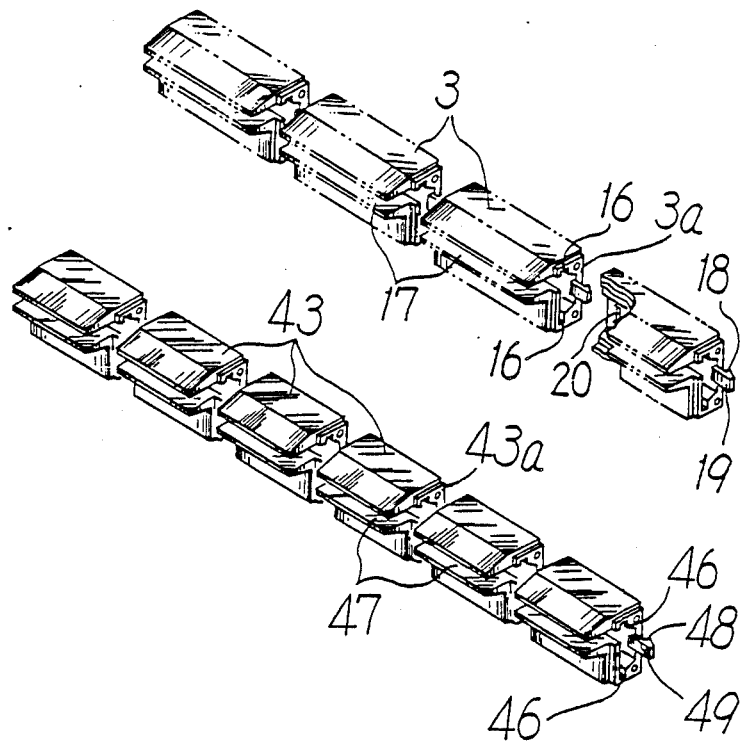
FIG. 6 is a perspective view of brackets showing the other embodiment.

It is convenient to prepare two varieties of brackets having different lengths; one whose length is three times as long as the center-to-center distance between adjoining solenoid valves 4 (see FIG. 1) and the other whose length is twice as long (see the lower ones in FIG. 6). By using one or more brackets selected from the above two varieties, any number of solenoid valves 4 can be coped with. On FIG. 6, each bracket 43 as same as the bracket 3, is provided with an engaging projection 43a, a recess like 3b, opposite engaging grooves 46, a longitudinal opening 47 and a catch 49 having a hook 48 at the tip thereof.

An end plate 21 closing one end of a series of brackets 3 has the catch 19 on that surface thereof that comes in contact with a bracket 3 and is fastened to the manifold base 1 by means of bolts 22 (as indicated by the arrow X). A connector 24 provided at the other end of the series of brackets 3 has the recess 20 and is fastened to the manifold base 1 by means of bolts 26 (as indicated by the arrow Y), with an integrally formed projection 25 placed on the top surface of the manifold base 1. The vertical fitting 10 of the printed-wiring board 2 is fastened to the connector 24 by means of bolts 27 and nuts 27a and housed in an overturned-U shaped cover 28 fitted on the connector 24.

All this eliminates the need to provide grooves to hold the printed-wiring board 2 in position on the manifold base 1 and, therefore, permits using common manifold bases intended to be used without a printed-wiring board. If tapped holes for the bolts 22 and 26 are provided, the same manifold base can be used both with and without a printed-wiring board.

For each set of fluid passages 8, a solenoid valve 4 is fastened to the top of the manifold base 1 with bolts 31 through a gasket 30. When thus mounted on the manifold base 1, the feed port, output ports and drain port (all not shown) of each solenoid valve 4 communicate with the individual fluid passages 8 through openings in the gasket 30.

As shown on FIG. 2, both types of double acting and single acting solenoid valves can be used. And in the case of double acting solenoid valves, each of these solenoid valves 4 is provided with power receiving terminals 32 leading to the solenoid at both ends thereof. A terminal 33 detachably connectable to the power-supply terminal 13 and terminals 34 detachably connectable to the power receiving terminals 32 are connected by power-feed lines 35. The combination of double-acting and single-acting solenoid valves showing on FIG. 2, may be changed depending on requirement.

Assembling of the above preferred embodiment will be described in the following.

In assembling, the end plate 21 is fastened to the manifold base 1 with bolts 22. Then, the brackets 3 of the number corresponding to that of the solenoid valves 4 to be mounted are fastened by engaging the projection 3a with the corresponding recess 3b and the hook 18 with the recess 20.

Next, the inserting segment 11 of the printed-wiring board 2 is inserted into the brackets 3, with both edges thereof fitted in the opposite engaging grooves 16. The power-supply terminals 13, placed side by side, are fitted in the openings 17. By then fastening the vertical fitting 10 to the connector 24 with the bolts 27 and nuts 27a, the printed-wiring board 2, brackets 3 and so on are attached to the manifold base 1. Thus, the power-supply segment can be assembled very easily.

The printed-wiring board 2 now integrally combined with the brackets 3 etc. is fastened to the manifold base 1, through the connector 24, by means of bolts 26. The vertical fitting 10 is then housed in the cover 28.

One solenoid valve 4 for each set of fluid passages 8 is mounted on the manifold base 1 and fastened thereto with bolts 31.

The terminal 33 at one end of the power-feed lines 35 is connected to the power-supply terminal 13 snugly inserted in the opening 17 in the bracket 3. The terminal 34 at the other end is connected to the power receiving terminal 32. Sticking out from the opening 17, the power-supply terminal 13 can be easily connected to the terminal 33.

The installation using brackets 43 instead of brackets 3 or combined using of these two types' brackets is same as the aforedescribed method.

What is claimed is:

1. A power supply system having a plurality of solenoid valves for assembly on a manifold base having a flat lateral side, said power supply system comprising:
   a plurality of brackets connected together to form a bracket assembly, each bracket of said plurality of brackets being of integral length as compared to a center-to-center distance between adjacent solenoid valves of said plurality of solenoid valves;
   an end plate fastened to a first end of said manifold base on the flat lateral side of said manifold base, said bracket assembly being connected to said end plate;
   a connector means fastened to a second end of said manifold base on the flat lateral side of said manifold base, said bracket assembly being connected to said connector means such that said bracket assembly is sandwiched between said end plate and said connector means;
   a printed wiring board having a horizontal portion upon which a plurality of power supply terminals are mounted, said printed wiring board having a vertical fitting portion located at an end of said printed wiring board, said vertical fitting portion being connected to said connector means, said vertical fitting portion having a multipolar connector;

said horizontal portion of said wiring board being fitted into a longitudinal opening along the length of said bracket assembly; and each bracket of said plurality of brackets, said end plate and said connector means are provided with mutually engaging catches and recesses.

2. A system according to claim 1, wherein:
said multipolar connector is connected to a power supply.

3. A system according to claim 1, further comprising:
electrical connection means for connecting said plurality of power supply terminals to corresponding solenoid valves of said plurality of solenoid valves:

4. A system according to claim 1, wherein:
a first portion of said plurality of brackets have a length twice the center-to-center distance between adjacent solenoid valves of said plurality of solenoid valves and a second portion of said plurality of brackets have a length three times the center-to-center distance between adjacent solenoid valves of said plurality of solenoid valves.

5. The system according to claim 1, wherein:
said bracket assembly has grooves for engaging the edges of the horizontal portion of said printed wiring board, said grooves being located inside said longitudinal opening along the length of said bracket assembly.

6. The system according to claim 1, wherein:
said end plate and said connector means are fastened to said manifold base by bolts.

7. The system according to claim 3, wherein:
said vertical portion of said wiring board is fastened to said connector means by a bolt.

* * * * *